United States Patent
Jiang et al.

[11] Patent Number: 6,118,080
[45] Date of Patent: Sep. 12, 2000

[54] Z-AXIS ELECTRICAL CONTACT FOR MICROELECTRONIC DEVICES

[75] Inventors: Tongbi Jiang; Edward A. Schrock, both of Boise, Id.

[73] Assignee: Micron Technology, Inc., Boise, Id.

[21] Appl. No.: 09/006,639

[22] Filed: Jan. 13, 1998

[51] Int. Cl.⁷ .................................................. H05K 1/00
[52] U.S. Cl. .................... 174/253; 174/255; 174/260; 439/66; 257/737; 257/738
[58] Field of Search ..................... 174/253, 254, 174/255, 260, 261, 265; 439/91, 66; 428/192, 206, 208; 361/773, 774; 257/778, 737, 738; 438/108, 613

[56] References Cited

U.S. PATENT DOCUMENTS

| | | | |
|---|---|---|---|
| 3,680,037 | 7/1972 | Nellis et al. | 439/591 |
| 3,971,610 | 7/1976 | Buchoff et al. | 439/75 |
| 4,184,729 | 1/1980 | Parks et al. | 439/66 |
| 4,808,112 | 2/1989 | Wood et al. | 439/66 |
| 5,342,207 | 8/1994 | Sobhani | 439/74 |
| 5,415,555 | 5/1995 | Sobhani | 439/74 |
| 5,744,758 | 4/1998 | Takenouchi et al. | 174/255 |
| 5,767,580 | 6/1998 | Rostoker | 257/737 |
| 5,866,951 | 2/1999 | Gademann et al. | 257/783 |
| 5,902,606 | 2/1990 | Patraw | 430/314 |

FOREIGN PATENT DOCUMENTS 0577031  6/1959  Canada .................................. 174/253

*Primary Examiner*—Kristine Kincaid
*Assistant Examiner*—Dhiru R. Patel
*Attorney, Agent, or Firm*—Trop, Pruner & Hu, P.C.

[57] ABSTRACT

A Z-axis electrical contact may be formed using a resinous deposit containing conductive particles which may align along surface regions to form an electrical conduction path over the resinous material. If the resinous material is thermoplastic, the material may be heated to mechanically bond to contact surfaces. Advantageously, the resinous material may be formed by forcing a resinous matrix containing conductive particles through an annular opening in a stencil. The resulting member allows surfaces to be contacted which may be irregular or may be covered by native oxide layers.

12 Claims, 1 Drawing Sheet

6,118,080

Z-AXIS ELECTRICAL CONTACT FOR MICROELECTRONIC DEVICES

This invention relates generally to electrical contacts and techniques for the making the same and particularly to techniques for making electrical contacts for microelectronic devices such as integrated circuit devices and contacts utilized with such devices.

BACKGROUND OF THE INVENTION

A variety of devices are known for making Z-axis electrical contacts. By "Z-axis" it is intended to refer to an element which extends transversely to the plane of the surface or surfaces to be contacted. One advantage of Z-axis contacts is that they accommodate for irregularities in one or more surfaces being contacted.

Metallic paste for forming electrical contacts has been known for some time. For example, solder pastes include conductive particles in a flux matrix. However, solder pastes have little ability to provide Z-axis connections because once heated they generally have little or no structural integrity.

In a variety of modern electronic packaging used for integrated circuits and other microelectronic devices, a plurality of contacts on one electrical component may be situated on contacts on another electrical component. In the presence of heat, the contacts on one component may melt or soften sufficiently to connect them to components on the other device. Many of these connections are advantageous because they occur in regions which could not be accessed otherwise. For example, surface mount packages and ball grid arrays may use this type of connection.

While these products may use conductive bumps, these bumps generally cannot accommodate for a variety of irregularities which may be encountered by contacts. One problem faced with conventional contacts is that a good electrical connection may not be possible between two contacts because a native oxide film has formed over one or more of the contacts which prevents the electrical connection. Another difficulty, described above, is that the contacting surfaces often are irregular so that good physical connection is not always possible.

Thus, there is a continuing need for a Z-axis contact which facilitates connection between surfaces which may be irregular, which improves the connection in a variety of surfaces, and which at least in some cases, facilitates connection between surfaces which may be occluded by a native oxide layer.

SUMMARY OF THE INVENTION

In accordance with one aspect of the present invention, an electrical contact for a microelectronic device includes a first contact pad and a resinous member having conductive particles. The member extends upwardly from the first contact pad.

In accordance with another aspect of the present invention, an electrical connection for a microelectronic device includes a first contact pad and a resinous member having conductive particles dispersed through the member. The resinous member has upper and lower ends. A second contact pad is connected to the upper end of the member and the first contact pad is connected to the lower end of the member.

In accordance with yet another aspect of the present invention, an electrical contact for a semiconductor device includes an annular member formed of conductive particles in a resinous matrix. The member is adapted to physically and electrically connect to conductive terminations.

In accordance with another aspect of the present invention, a method of electrically contacting a surface includes the step of depositing an annular member formed of conductive particles in a resinous matrix. The member is physically connected between a pair of conductive surfaces.

In accordance with but another aspect of the present invention, a method of making electrical contact includes the step of forming an upstanding conductive, annular member on a first contact surface. The member contacts a second contact surface. The member is heated to bond the member to the second contact surface.

In accordance with yet another aspect of the present invention, a stencil for forming a deposit for making electrical contact includes an annular opening formed in the stencil. At least one bridge element spans across the annular opening.

In accordance with another aspect of the present invention, a method of forming a deposit in making semiconductor devices includes the step of forming at least one annular opening in a plate to form an inner member inward of the opening and an outer member outward of the opening. A physical connection is maintained between the inner and outer members.

In accordance with but another aspect of the present invention, a resinous electrically conductive material includes a resinous body having an edge surface. A plurality of electrically conductive particles lap one another along the edge surface so as to form an electrically conductive path along the edge surface.

DESCRIPTION OF THE PREFERRED EMBODIMENTS

Figure 1:
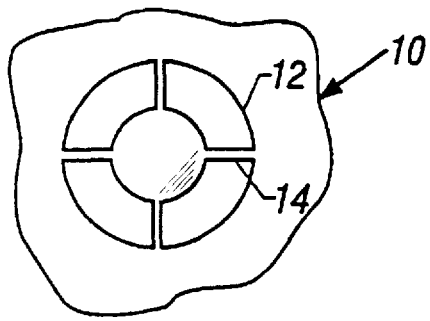
FIG. 1 is a partial top plan view of one embodiment of a stencil useful in connection with the present invention.

Referring to the drawing wherein like reference characters are used for like parts throughout the several views, a stencil 10 for forming a contact member is shown in FIG. 1. The stencil is illustrated as having an annular opening 12 spanned by bridging elements 14. Thus, the illustrated stencil 10 is capable of forming circular, annular deposits. The stencil 10 may be formed using conventional techniques used to form solder stencils. The stencil 10 may, for example, be laser cut or may be chemically etched. Other noncircular, closed annular shapes may be formed using stencils of the type illustrated in FIG. 1, with bridging elements 14.

Figure 2:
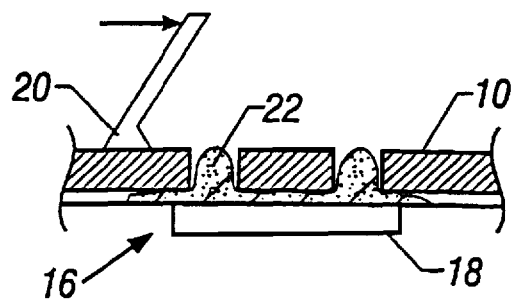
FIG. 2 is an enlarged cross-sectional view showing the stencil of FIG. 1 in position on a microelectronic device in the process of forming a Z-axis contact.

Referring now to FIG. 2, the stencil 10 is shown in position atop support structure 16 which could be a part of a variety of microelectronic elements. Among the potential support structures 16 are a die or chip, a printed circuit board, or a flexible card. The support structure 16 includes a conductive contact pad 18 over which is situated the stencil 10. A resinous matrix with interspersed conductive particles is forced through the stencil 10 using a squeegee blade 20 or the like to form the resinous member 22 in the form of an interrupted circular annulus. The resulting member 22, is annular and tapers in thickness as it extends upwardly.

A wide variety of materials may be used as the resinous conductive member 22. For example, a resinous matrix with metallic particles such as silver, nickel or iron flakes or gold plated nickel flakes may be utilized such that the conductive particles are capable of making the member 22 conductive.

Figure 5:
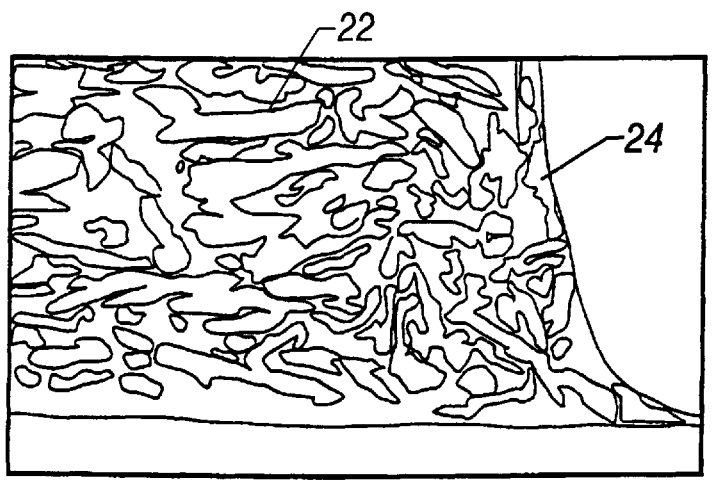
FIG. 5 is an enlarged photomicrographic depiction of a conductive resinous matrix useful in connection with the embodiments shown in the previous figures.

As shown in FIG. 5, the conductive flakes 24 may coalesce or align along surface regions to form a conductive path comprised of a series of contacting conductive flakes. While the precise physical reason why these aligned particles are formed at surface regions is not known, it is believed that it may be a function of surface tension.

A wide variety of resinous matrices may be utilized including polymeric adhesives, epoxies, thermosetting, thermoplastic, and B-stagable resins which may not be fully cross-linked and other highly thixotropic resins. One particularly preferred resin is polyimide. It is advantageous since it is thermoplastic and may have a thixotropic index of 6 or greater. An advantageous viscosity range is 200,000 centipoise.

The thickness of the stencil and the resulting height of the member 22 is subject to considerable variation. Useful stencil heights include heights from about 3 to about 10 mils. Members 22 for flip chips may have a height range of approximately 3 mils.

The conductive particle size depends on the aspect ratio of the member 22. However, the particle lengths of ¼ to 1 mil would be advantageous in connection with the present invention. The loading factor of conductive particles is advantageously approximately 80%.

One suitable metal flake 24 is a silver flake available from NanoPowders Industries, L.C. of Bay Harbour Islands, Fla. 33154. With these types of materials, an annular stencil opening of approximately 1 mil measured radially is suitable.

Figure 3:
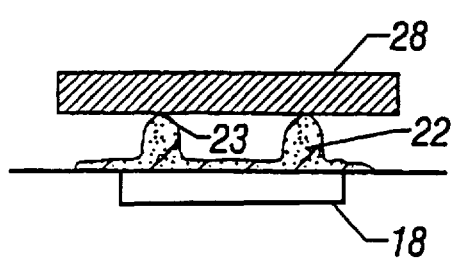
FIG. 3 is an enlarged cross-sectional view of a connection achieved by way of the Z-axis contact shown in FIG. 2.

With a thermoplastic material forming resinous member 22, as shown in FIG. 3, a bond pad 28 may be situated atop the member 22. In this condition, the member 22 may be cured at a temperature above $T_g$ which is the glassy transition temperature of the member 22. Above $T_g$ the upper end 23 of the member 22 bonds to the bond pad 28.

Because of the pointed upper end 23 of the member 22, any remaining oxide on the contact surface of the bond pad 28 may be penetrated insuring a good electrical contact. In addition, if there are surface irregularities in the bond pad 28, those can be accommodated for during the softening of the member 22, again, to insure good electrical contact. Particularly with aluminum bond pads, the potential for aluminum oxides to form on the surface of the bond pad is significant. Thus, the ability of the contact to make contact through that oxide is beneficial.

With thermosetting resinous matrices, it may be necessary to hold the contact in place using additional adhesive. The additional adhesive (not shown) may be positioned around the member 22.

The stencil 10 may be provided with a large number of apertures which can simultaneously print a large of number of members 22 on a variety of bond pads. For example, a semiconductor wafer can be printed with a large number of the conductive members 22 using conventional printing techniques well known to those of ordinary skill in this field. Alternatively, pin transfer techniques may be utilized.

Figure 4:
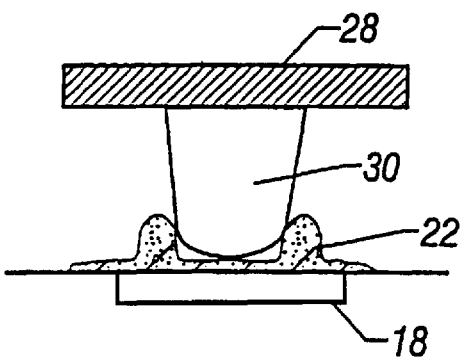
FIG. 4 is an enlarged cross-sectional view of another Z-axis connection in accordance with an alternate embodiment.

Instead of making direct contact with the bond pad 28, an intervening conductive bump 30 may be provided on the bond pad 28, as shown in FIG. 4. In this situation, the annular arrangement of the member 22 facilitates and guides the conductive bump 30 into alignment with the member 22.

While the present invention has been described with respect to a limited number of embodiments, those skilled in the art will appreciate numerous modifications and variations. For example, a plurality of concentric annular members 22 could be used. It is intended that the appended claims cover all such modifications and variations as fall within the true spirit and scope of the present invention.

What is claimed is:

1. An electrical contact for a microelectronic device comprising:
   a first contact pad; and
   a free standing resinous member having conductive particles and an edge surface, said particles lapping one another along said edge surface so as to form an electrically conductive path along said edge surface, said member extending upwardly from said first contact pad, said member in the form of an upstanding annular shape.

2. The contact of claim 1 wherein said annular shape tapers as it extends upwardly.

3. The contact of claim 2 wherein said member is made of a polymeric resin and said conductive particles are metallic flakes.

4. The contact of claim 1 wherein said resin is thermoplastic.

5. An electrical connector for a microelectronic device comprising:
   a first contact pad;
   a free standing resinous member having conductive particles dispersed through said member and having upper and lower ends and an edge surface, said particles lapping one another along said edge surface so as to form an electrically conductive path along said edge surface; and
   a second contact pad connected to the upper end of said member, said first contact pad connected to the lower end of said member, said member being of an annular configuration.

6. The connector of claim 5 wherein said conductive particles are metallic.

7. The connector of claim 6 wherein said thermoplastic resin is heat bonded to said first and second pads.

8. The connector of claim 1 wherein said member includes a resin having a thixotropic index of about 6 or greater.

9. The connector of claim 1 wherein said member has a viscosity of approximately 200,000 centipoise.

10. The connector of claim 8 wherein said conductive particles are silver flakes.

11. The connector of claim 10 wherein said silver flakes have a particle size of ¼ to 1 mil.

12. The connector of claim 5 wherein said member has a height of from about 3 to about 10 mil.

\* \* \* \* \*